United States Patent
Jeon et al.

(10) Patent No.: US 11,705,889 B2
(45) Date of Patent: Jul. 18, 2023

(54) COMPACT DIGITAL ATTENUATOR

(71) Applicant: KOREA UNIVERSITY RESEARCH AND BUSINESS FOUNDATION, Seoul (KR)

(72) Inventors: Sanggeun Jeon, Seoul (KR); Kwangwon Park, Daejeon (KR); Seung Jong Lee, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 146 days.

(21) Appl. No.: 17/155,291

(22) Filed: Jan. 22, 2021

(65) Prior Publication Data
US 2022/0131531 A1    Apr. 28, 2022

(30) Foreign Application Priority Data
Oct. 23, 2020  (KR) .......................... 10-2020-0138420

(51) Int. Cl.
*H03H 17/00*  (2006.01)
*H03H 7/25*  (2006.01)

(52) U.S. Cl.
CPC .......... *H03H 17/0054* (2013.01); *H03H 7/25* (2013.01)

(58) Field of Classification Search
CPC .............................. H03H 17/0054; H03H 7/25
USPC ......................................................... 708/208
See application file for complete search history.

(56) References Cited

U.S. PATENT DOCUMENTS

| 2003/0132814 | A1* | 7/2003 | Nyberg | H01P 1/227 333/81 R |
| 2005/0162220 | A1* | 7/2005 | Behzad | H03H 11/245 327/559 |
| 2006/0031689 | A1* | 2/2006 | Yang | G06F 1/26 713/300 |
| 2013/0043962 | A1* | 2/2013 | Granger-Jones | H03H 7/25 333/81 R |

FOREIGN PATENT DOCUMENTS

CN            111130503 A  *  8/2020

* cited by examiner

*Primary Examiner* — Tomi Skibinski
(74) *Attorney, Agent, or Firm* — NSIP Law

(57) ABSTRACT

Provided is a compact digital attenuator. The compact digital attenuator includes a first attenuation cell to an nth attenuation cell, which include a plurality of attenuation cells connected to each other in parallel through a transmission line, wherein each of the plurality of attenuation cells may include a plurality of switch elements connected to each other in parallel, wherein the plurality of switch elements may be connected to the transmission line through one contact point.

3 Claims, 13 Drawing Sheets

- prior art -

- prior art -

(a) 0 dB Attenuation (b) 1 dB Attenuation (c) 2 dB Attenuation (d) 3 dB Attenuation (a) 0 dB Attenuation (b) 1 dB Attenuation (c) 2 dB Attenuation (d) 3 dB Attenuation

FIG. 7

| driving method | transistor | resistance value |
|---|---|---|
| driving method 1 | $M_4$ | $4Z_0$ |
| | $M_5$ | $1.9Z_0$ |
| | $M_6$ | $1.2Z_0$ |
| driving method 2 | $M_4$ | $4Z_0$ |
| | $M_5$ | $3.6Z_0$ |
| | $M_6$ | $3.2Z_0$ |

FIG. 10

| Attenuation state(dB) | $M_1$ | $M_2$ | $M_3$ | $M_4$ | $M_5$ | $M_6$ | $M_7$ | $M_8$ | $M_9$ | $M_{10}$ | $M_{11}$ | $M_{12}$ |
|---|---|---|---|---|---|---|---|---|---|---|---|---|
| 0 | — | — | — | — | — | — | — | — | — | — | — | — |
| 1 | — | — | — | O | — | — | — | — | — | — | — | — |
| 2 | — | — | — | O | — | — | O | — | — | — | — | — |
| 3 | — | — | — | O | O | — | O | — | — | — | — | — |
| 4 | — | — | — | O | O | — | O | O | — | — | — | — |
| 5 | — | — | — | O | O | O | O | — | — | — | — | — |
| 6 | — | — | — | O | O | O | O | O | — | — | — | — |
| 7 | O | — | — | O | O | O | O | O | — | — | — | — |
| 8 | — | — | — | O | O | O | O | O | O | — | — | — |
| 9 | O | — | — | O | O | O | O | O | O | — | — | — |
| 10 | O | O | — | O | O | O | O | O | O | — | — | — |
| 11 | O | O | O | O | O | O | O | O | O | — | — | — |
| 12 | O | O | O | O | O | O | O | O | O | O | — | — |
| 13 | O | O | O | O | O | O | O | O | O | O | O | — |
| 14 | O | O | O | O | O | O | O | O | O | O | O | O |

COMPACT DIGITAL ATTENUATOR

CROSS-REFERENCE TO RELATED APPLICATION

This application claims under 35 U.S.C. § 119(a) the benefit of Korean Patent Application No. 10-2020-0138420 filed on Oct. 23, 2020, the entire contents of which are incorporated herein by reference.

BACKGROUND

(a) Technical Field

The present invention relates to a compact digital attenuator.

(b) Background Art

A digital attenuator is one of important circuit blocks that serves to finely control a signal size between array channels or suppressing a signal of a side lobe beam by controlling the amplitude of a signal in a phased array system. In general, as performance indicators of the digital attenuator, an attenuation range, an attenuation interval, a bandwidth, an insertion loss, an amplitude, phase errors, and the like are considered.

The digital attenuator may be largely divided into T- and Pi-type attenuators and a distributed attenuator.

FIG. 1 is a diagram illustrating unit structures of general T- and Pi-attenuators. The T- and Pi-attenuators have an advantage of realizing a wide attenuation range and a fine attenuation interval in a small area by using a switching transistor with low loss.

However, in general, the T- and Pi attenuators have relatively large phase errors due to a parasitic capacitance component of a transistor connected in series with a signal transmission path. This structure is widely used in a compound process such as GaAs, which exhibits excellent transistor performance by determining a bandwidth, insertion loss, and input/output matching performance due to transistor performance, and has a disadvantage that it is difficult to be used in a silicon process with relatively low performance.

FIG. 2 is a diagram illustrating a general distributed attenuator. In the case of the distributed attenuator, unlike the T- and Pi-attenuators, there is an advantage of implementing relatively small insertion loss and phase errors without transistors connected in series. However, the distributed attenuator implements only one step of attenuation in one unit cell, and has a disadvantage that long transmission lines are disposed between respective cells to have a large chip area and a narrow attenuation range.

Therefore, there is a need for a method for solving these problems.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

An object of the present invention is to provide a compact digital attenuator that serves to control the amplitude of a signal using a multi-state structure in a phased array system.

Another object of the present invention is to provide a compact digital attenuator that has a small phase error and can be used even in a silicon process with poor switching performance.

Yet another object of the present invention is to provide a compact digital attenuator capable of miniaturizing transmission and reception chips used in 5G band terminals and increasing the resolution of a phased array radar system.

According to an aspect of the present invention, there is provided a compact digital attenuator.

According to an embodiment of the present invention, there is provided a compact digital attenuator including a first attenuation cell to an nth attenuation cell, which include a plurality of attenuation cells connected to each other in parallel through a transmission line, wherein each of the plurality of attenuation cells may include a plurality of switch elements connected to each other in parallel, wherein the plurality of switch elements may be connected to the transmission line through one contact point.

Each of the plurality of attenuation cells operates in a multi-attenuation state, and the plurality of switch elements included in each of the plurality of attenuation cells may be selectively turned on according to an attenuation state.

The plurality of switch elements included in each of the plurality of attenuation cells may be turned off as a default, any one of the plurality of switch elements may be selectively turned on according to the attenuation state to attenuate the signal, and the sizes of the plurality of switch elements may be different from each other.

The plurality of switch elements included in each of the plurality of attenuation cells may be turned off as a default, the number of switch elements to be turned on according to the attenuation state may vary, and the signal input through the transmission line may be attenuated in response to a value obtained by calculating resistors of the turned-on switch elements in parallel.

The plurality of switch elements may be an N-type transistor which is any one of an N-type FET and an N-type BJT.

Each drain of the plurality of switch elements included in one attenuation cell may be connected to the transmission line through the one contact point, and each source may be connected to the ground.

By providing the compact digital attenuator according to an embodiment of the present invention, there is an advantage of implementing various types of attenuation in one attenuation cell.

In addition, according to the present invention, there is an advantage that the compact digital attenuator has a small phase error and can be used even in a silicon process with poor switch performance.

In addition, according to the present invention, there is an advantage of having excellent input/output matching in a wide band and not affecting the performance of circuits located at front and rear ends.

Further, according to the present invention, it is possible to miniaturize transmission and reception chips used in 5G band terminals and increase the resolution of a phased array radar system.

The effects of the present invention are not limited to the aforementioned effect, and other effects not mentioned above will be clearly understood to those skilled in the art from the description of the appended claims.

BRIEF DESCRIPTION OF THE DRAWINGS

FIG. 7 is a diagram illustrating a resistance value according to an operation of an attenuation cell having a multi-state structure according to an embodiment of the present invention.

FIG. 10 is a diagram illustrating a combination of switch elements that are turned on/off for each attenuation state according to an embodiment of the present invention.

DETAILED DESCRIPTION

A singular form used in the present specification may include a plural form if there is no clearly opposite meaning in the context. In this specification, terms such as "comprising" or "including" should not be interpreted as necessarily including all various components or various steps disclosed in the specification, and it should be interpreted that some component or some steps among them may not be included or additional components or steps may be further included. In addition, terms including "unit', "module", and the like disclosed in the specification mean a unit that processes at least one function or operation and this may be implemented by hardware or software or a combination of hardware and software.

Hereinafter, embodiments of the present invention will be described in detail with reference to the accompanying drawings.

Figure 1:
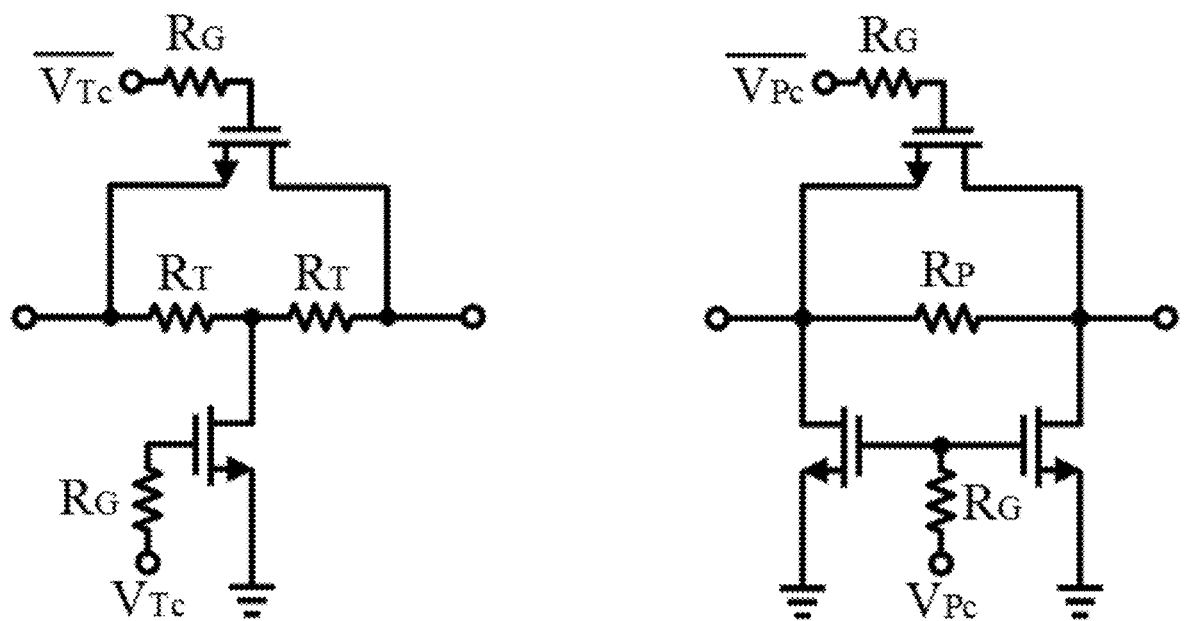
FIGS. 1 and 2 are diagrams illustrating attenuators in the related art.
Figure 2:
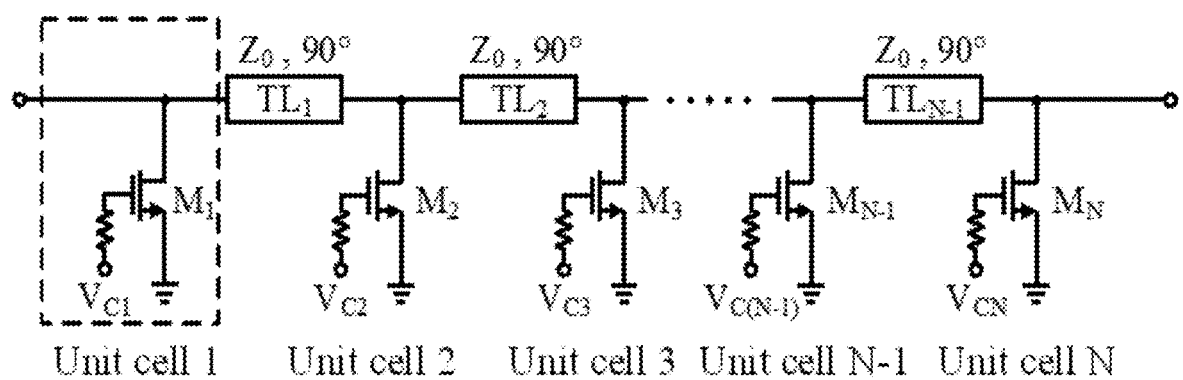
Figure 3:
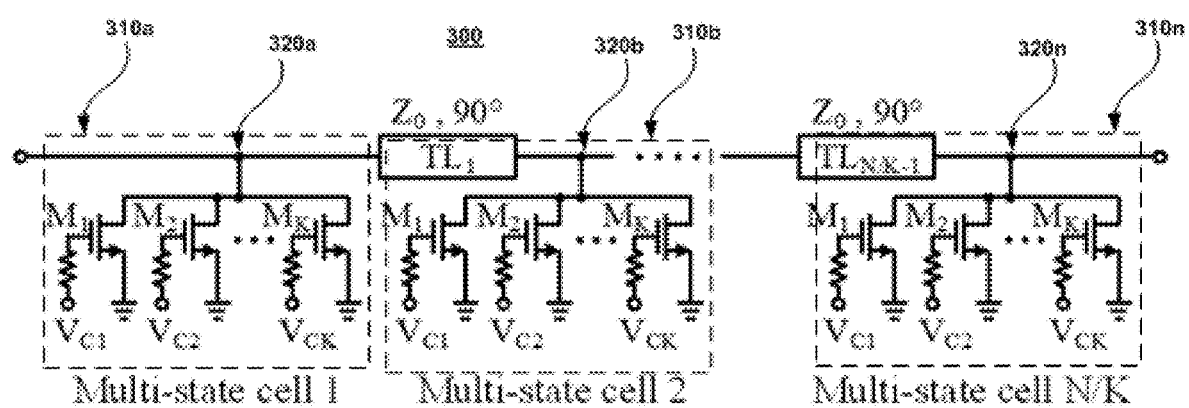
FIG. 3 is a diagram illustrating a distributed digital attenuator according to an embodiment of the present invention.
Figure 4:
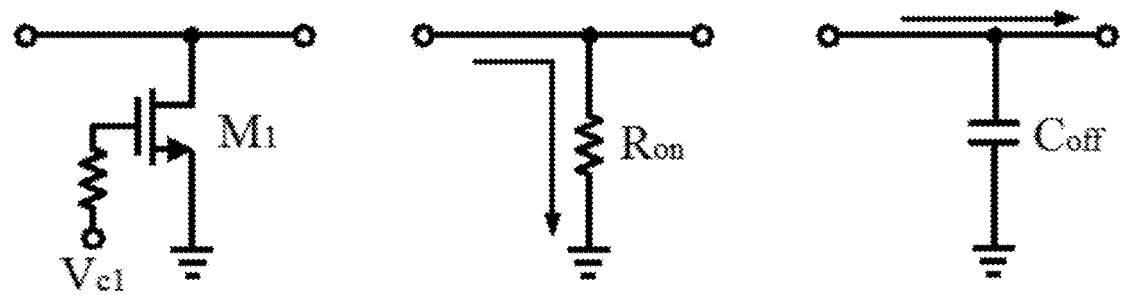
FIG. 4 is a diagram illustrating states according to on/off of a switch element according to an embodiment of the present invention.
Figure 5:
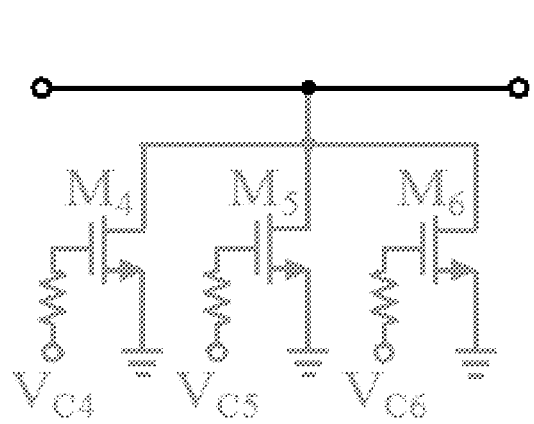
FIGS. 5 and 6 are diagrams illustrating operations of an attenuator having a multi-attenuation state according to an embodiment of the present invention.
Figure 5:
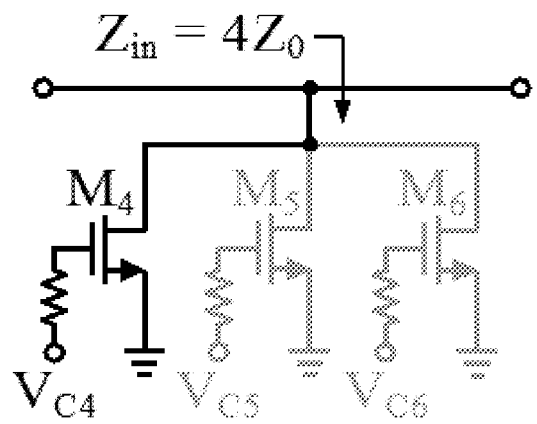
Figure 5:
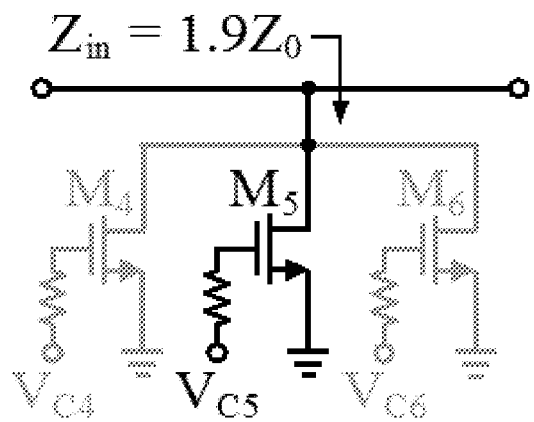
Figure 5:
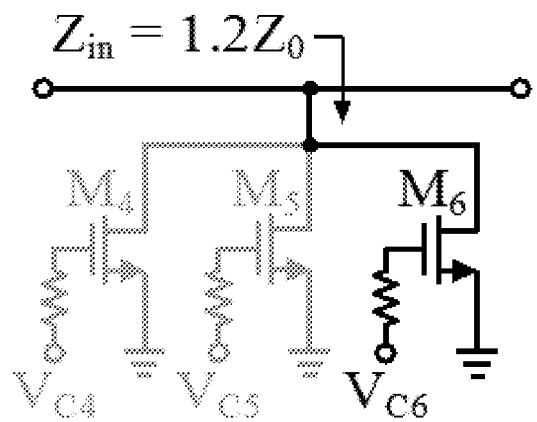
Figure 6:
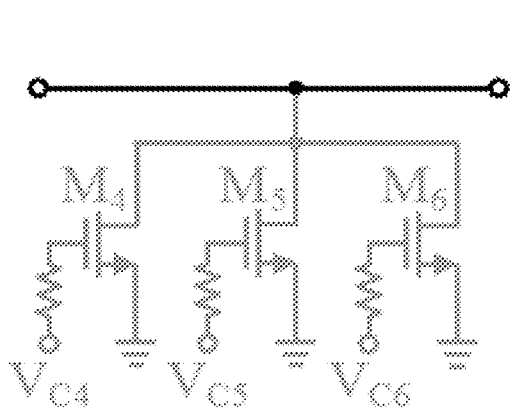
Figure 6:
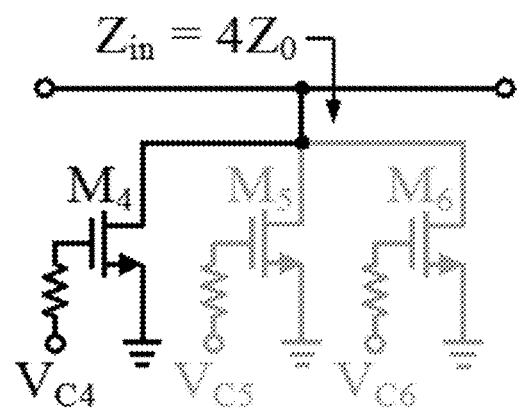
Figure 6:
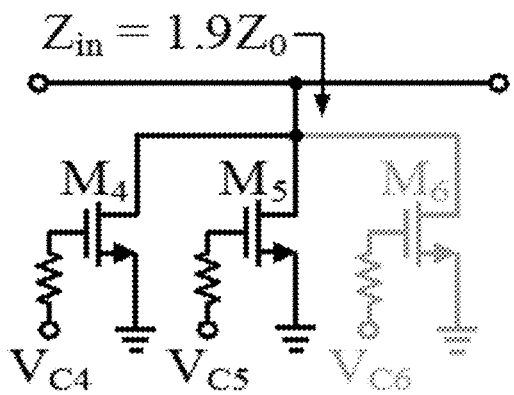
Figure 6:
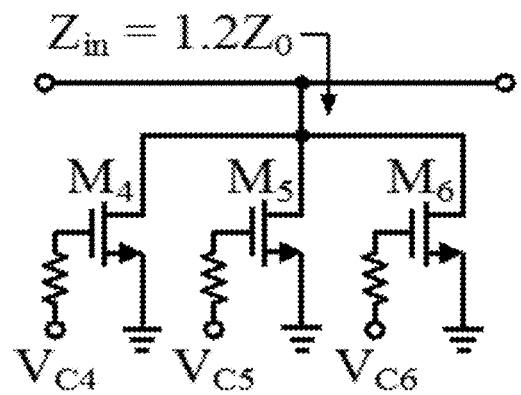

FIG. 3 is a diagram illustrating a distributed digital attenuator according to an embodiment of the present invention, FIG. 4 is a diagram illustrating states according to on/off of a switch element according to an embodiment of the present invention, FIGS. 5 and 6 are diagrams illustrating operations of an attenuator having a multi-attenuation state according to an embodiment of the present invention, and FIG. 7 is a diagram illustrating a resistance value according to an operation of an attenuation cell having a multi-state structure according to an embodiment of the present invention.

Referring to FIG. 3, a distributed digital attenuator 300 according to an embodiment of the present invention includes a plurality of attenuation cells 310a, 310b, ..., 310n, and the attenuation cells 310a, 310b, ..., 310n are connected to each other in parallel through a transmission line, respectively.

The attenuation cells may be connected to each other in parallel through a transmission line of 90°, respectively.

According to an embodiment of the present invention, each attenuation cell includes K (here, K is a natural number) switch elements M1, M2, ..., MK.

The K switch elements M1, M2, ..., MK included in the attenuation cell are connected to the transmission line through one contact point 320a, 320b, ..., 320n, but the K switch elements may be connected to each other in a parallel structure.

That is, the K switch elements included in each attenuation cell may be located inside the attenuation cell in a parallel structure in which the K switch elements are connected to a transmission line through which the attenuation cells are connected to each other in parallel, through one contact point.

According to an embodiment of the present invention, the K switch elements may be other types of N-type transistors such as an N-type FET or an N-type BJT. Hereinafter, it is assumed that the K switch elements are N-type transistors, and this will be mainly described.

Drains of a first transistor M1 to a Kth transistor MK included in each attenuation cell may be connected to the transmission line through one contact point. Sources of the first transistor M1 to the Kth transistor MK included in each attenuation cell are connected to the ground, respectively.

Accordingly, as a voltage is applied to gates of the first transistor M1 to the Kth transistor MK through a 20 kOhm resistor, the first transistor M1 to the Kth transistor MK may be turned on or off.

For convenience of understanding and explanation, an operation method when a transistor is connected in parallel to a transmission path (line) will be briefly described with reference to FIG. 4.

When a drain-source voltage of the transistor is maintained at 0 V and a voltage of 1 V is applied to the gate, the transistor is turned on, operates in a triode region, and operates like a resistor having a specific value. In addition, if the drain-source voltage of the transistor is maintained at 0 V and a voltage of 0 V is applied to the gate, the transistor is turned off and operates like a capacitor having a specific value.

As illustrated in FIG. 4, in the case where the transistor is connected in parallel to the transmission line of the signal, when the transistor is turned on, the signal is removed through the resistor and thus, attenuation occurs, and when the transistor is turned off, the signal is blocked by the capacitor and is not removed, and thus the attenuation does not occur.

According to an embodiment of the present invention, a plurality of transistors (first transistor M1 to Kth transistor MK) may be connected to a transmission line in parallel through a single node in an attenuation cell with a multi-state structure. Accordingly, one attenuation cell may implement K attenuation states.

According to an embodiment of the present invention, there may be two methods of implementing the multi-attenuation state of the attenuation cell. This will be described in more detail with reference to FIGS. 5 and 6.

For convenience of understanding and explanation, it is assumed that the attenuation cell is configured by three switch elements that implement attenuation states of 1 dB, 2 dB, and 3 dB, and a method of implementing a multi-attenuation state in the attenuation cell in such a structure will be described.

First, this will be described with reference to FIG. 5.

It is assumed that the three switch elements included in the attenuation cell are in an off state as a default state. In this state, only one of the three switch elements included in the attenuation cell may be selectively turned on according to each attenuation state.

In this case, a resistance value required in each attenuation state can be adjusted by the size of the switch element (transistor), and the resistance of the switch element required to implement 1 dB to 3 dB is as illustrated in FIG. 7.

In the case of the attenuation state of 0 dB, all of the switch elements (transistors) included in the attenuation cell (i.e., connected in parallel through one contact point) are in an off state. Since the signal flows through the transmission line and all the switch elements included in the attenuation cell are turned off, no attenuation occurs at all. Thus, an unattenuated signal reaches an output end.

In the case of the attenuation of 1 dB, only a switch element M4 in the attenuation cell is turned on, and the size of the switch element has been determined so that the impedance shown in parallel at a contact point becomes 4Z0 when only the switch element M4 is turned on.

In the case of the attenuation of 2 dB, only a switch element M5 in the attenuation cell is turned on, and the size of the switch element has been determined so that the impedance shown in parallel at a contact point becomes 1.9Z0 when only the switch element M5 is turned on.

In the case of the attenuation of 3 dB, only a switch element M6 in the attenuation cell is turned on, and the size of the switch element has been determined so that the impedance shown in parallel at a contact point becomes 1.2Z0 when only the switch element M6 is turned on.

As such, the size of the transistor may be determined so that any one of the plurality of switch elements connected in parallel to the attenuation cell through one contact point is selectively turned on according to the attenuation state to implement attenuation. The resistance value required to implement the multi-attenuation state may be adjusted by the size of each transistor.

FIG. 6 illustrates a method of additionally turning on a plurality of switch elements connected in parallel to the attenuation cell through one contact point according to an attenuation state. This will be described.

In FIG. 5, only one of the plurality of switch elements connected in parallel through one contact point in the attenuation cell is independently turned on according to the attenuation state, while the driving method of FIG. 6 is a method of turning on the switch elements as many as necessary according to the attenuation state. In the case of FIG. 6, the resistance value required for attenuation is not determined by one switch element, but is determined by parallel resistance values of the switched elements that are turned on.

For example, when the switch elements M4 and M5 are turned on, a value obtained by calculating the two resistors in parallel may be 1.9Z0. In addition, when all of the switch elements M4, M5, and M6 are turned on, a value obtained by calculating the three resistors in parallel may be 1.2Z0.

As illustrated in FIG. 7, it can be seen that the method of turning on the required number of switch elements according to the attenuation state requires a larger resistance value than determining the resistance value by the size of one switch element.

Figure 8:
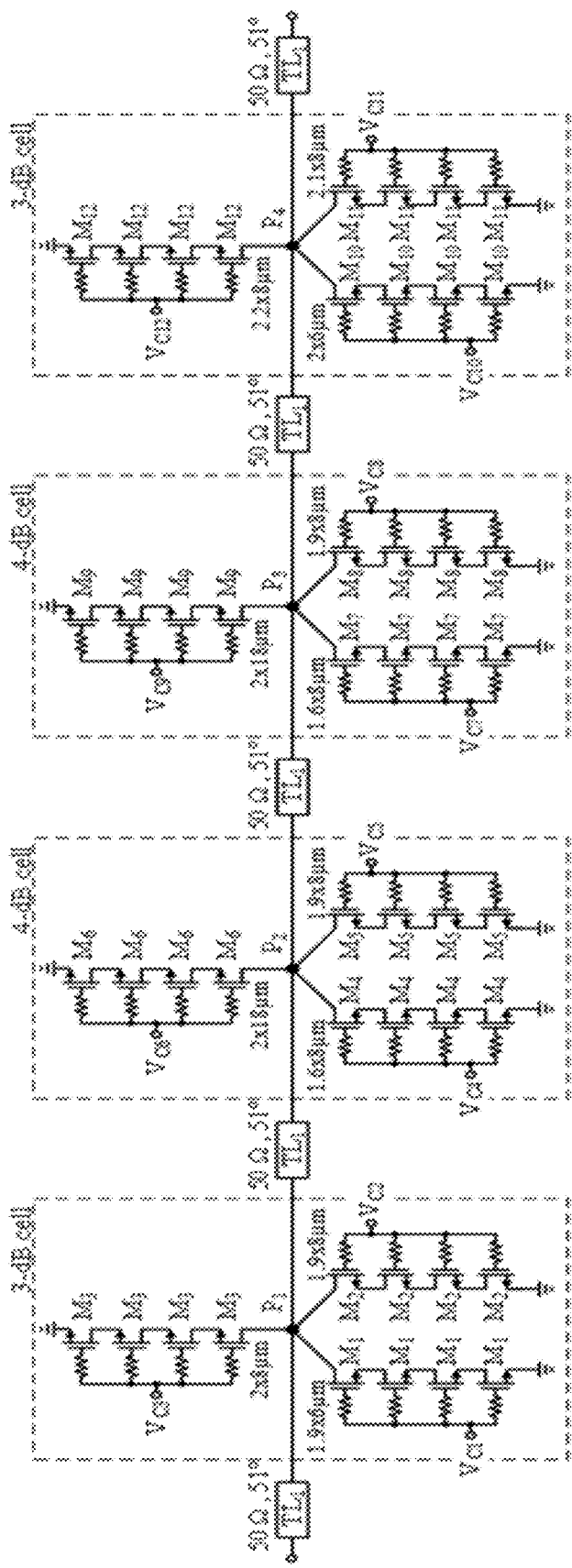
FIG. 8 is a diagram illustrating a structure of a compact digital attenuator according to another embodiment of the present invention.
Figure 9:
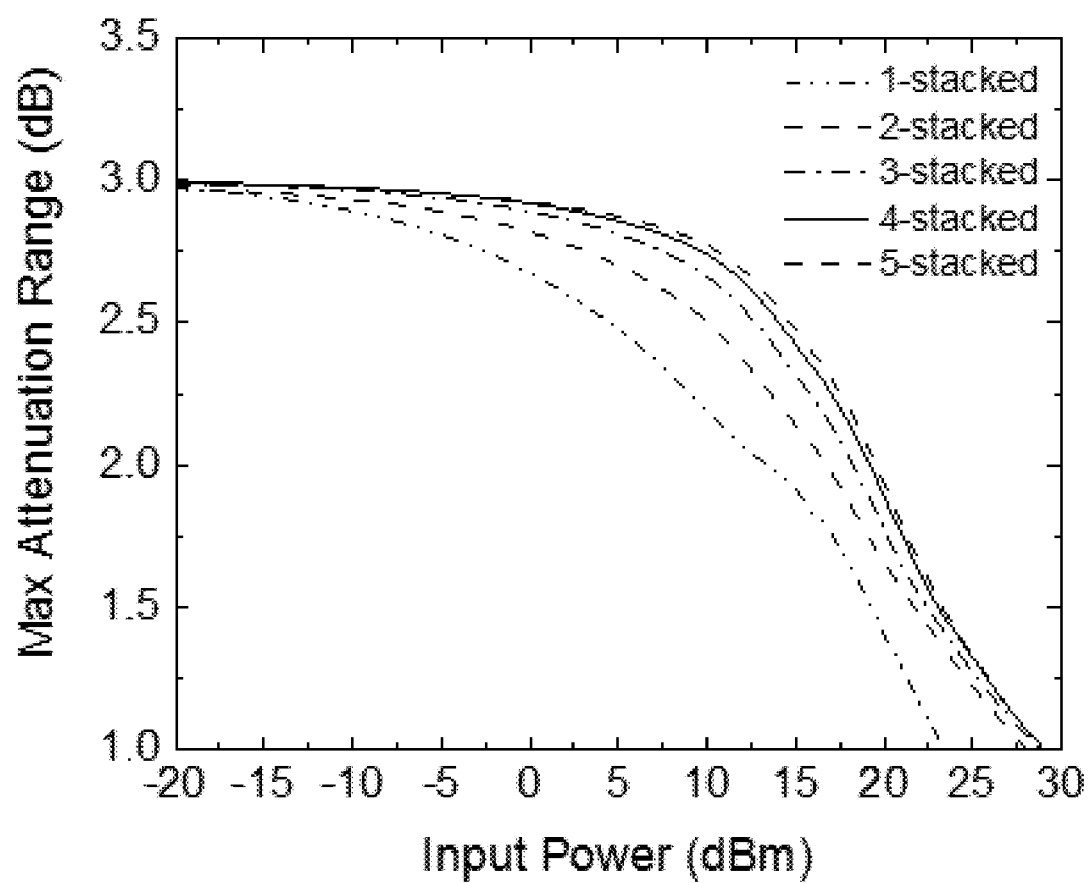
FIG. 9 is a graph showing a change in a maximum attenuation range according to the intensity of an input signal according to stacking of switch elements according to an embodiment of the present invention.
Figure 11:
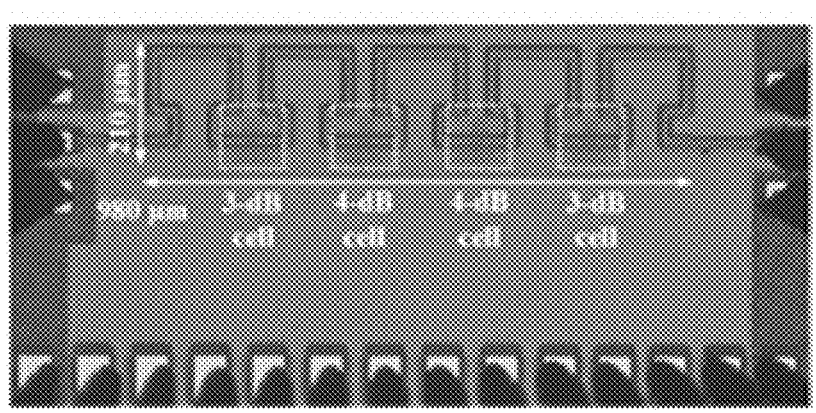
FIG. 11 is a diagram illustrating a photograph of an attenuator implemented according to an embodiment of the present invention.
Figure 12:
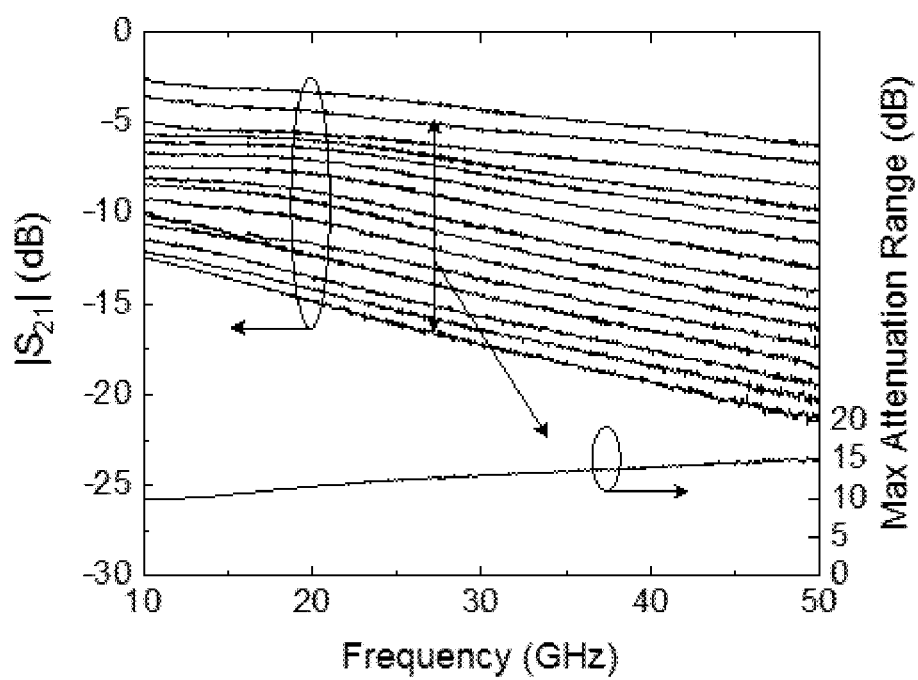
FIG. 12 is a graph showing attenuation performance of an attenuator according to an embodiment of the present invention.
Figure 13:
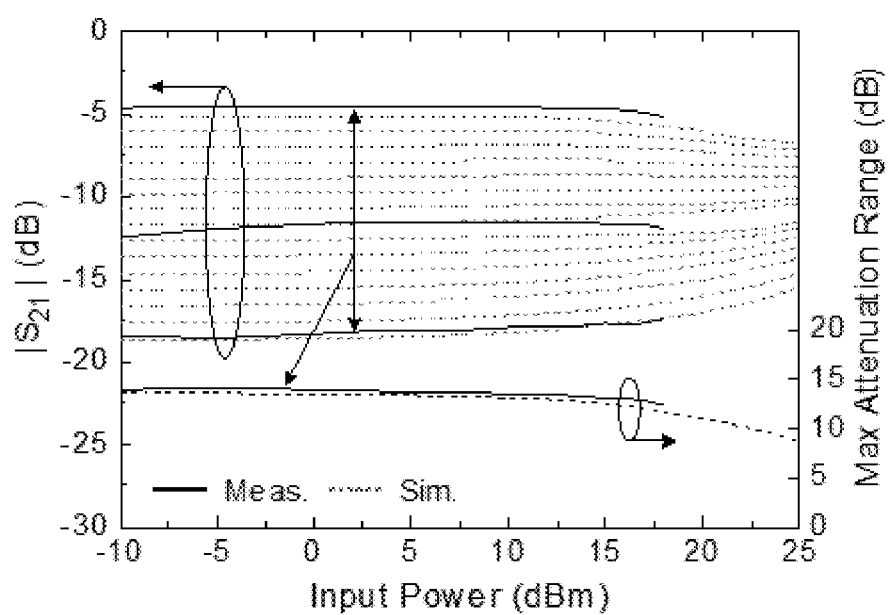
FIG. 13 is a graph showing P1 dB measured at 35 GHz according to an embodiment of the present invention.
Figure 14:
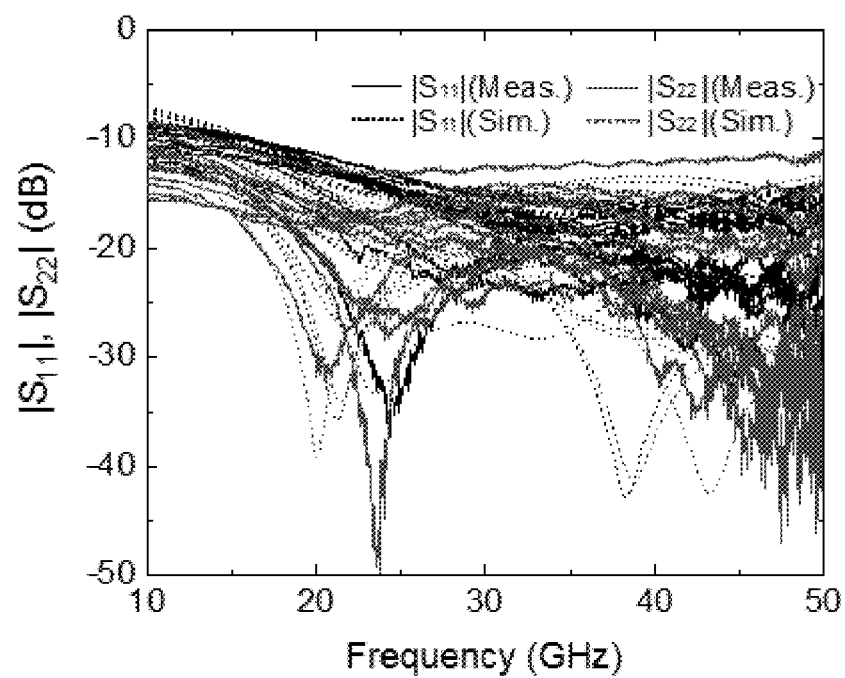
FIG. 14 is a graph showing input/output matching characteristics of an attenuator according to an embodiment of the present invention.

FIG. 8 is a diagram illustrating a structure of a compact digital attenuator according to another embodiment of the present invention, FIG. 9 is a graph showing a change in a maximum attenuation range according to the intensity of an input signal according to stacking of switch elements according to an embodiment of the present invention, and FIG. 10 is a diagram illustrating a combination of switch elements that are turned on/off for each attenuation state according to an embodiment of the present invention. In addition, FIG. 11 is a diagram illustrating a photograph of an attenuator implemented according to an embodiment of the present invention, FIG. 12 is a graph showing attenuation performance of an attenuator according to an embodiment of the present invention, FIG. 13 is a graph showing P1 dB measured at 35 GHz according to an embodiment of the present invention, and FIG. 14 is a graph showing input/output matching characteristics of an attenuator according to an embodiment of the present invention.

As illustrated in FIG. 8, according to an embodiment of the present invention, in order to increase linearity, an attenuation cell may be configured in a stack structure in which switch elements are stacked in the attenuation cell.

This will be described in more detail with reference to FIG. 8.

In each attenuation cell, switch element groups configured in a stacked stack structure may be connected to each other in parallel through one contact point. FIG. 8 illustrates a structure in which three switch element groups (transistor groups) formed in the stacked stack structure are connected to each other in parallel through one contact point. In FIG. 8, it is assumed that three switch element groups are connected in parallel to one attenuation cell, and this is mainly illustrated, but the number of switch element groups is not necessarily limited to three.

FIG. 9 is a graph showing a change in a maximum attenuation range according to the intensity of an input signal as the number of stacked switch elements (transistors) is increased in order to increase the linearity of the attenuation cell.

As shown in FIG. 9, it can be seen that there is little difference in performance when four or more switch elements (transistors) are stacked. Accordingly, in an embodiment of the present invention, four switch elements (transistors) were stacked.

The digital attenuator of FIG. 8 was implemented to have a bandwidth of 10 to 50 GHz using a 65-nm CMOS process, an attenuation range of 14 dB, and an attenuation interval of 1 dB. The digital attenuator was configured by two 3 dB attenuation cells and two 4 dB attenuation cells. The digital attenuator of FIG. 8 is only an example, and it is natural that the attenuation cell may be configured in various combinations.

In an embodiment of the present invention, each attenuation cell may have three attenuation states, and it is assumed that a 3 dB attenuation cell has attenuation states of 1 dB, 2 dB, and 3 dB, and a 4 dB attenuation cell has attenuation states of 1 dB, 2 dB and 4 dB.

In addition, for convenience, the contact points of each attenuation cell will be referred to as P1, P2, P3, and P4 in order from the left.

In the 3 dB attenuation cell, the size of the switch element may be formed so that an impedance shown in parallel at the contact point becomes 4Z0 when only a switch element (M1/10) is turned on, 1.9Z0 when only a switch element (M1, M2)/(M10, M11) is turned on, and 1.2Z0 when all switching elements (M1, M2, M3)/(M10, M11, M12) are turned on.

In addition, in the 4 dB attenuation cell, the size of the switch element may be formed so that an impedance shown in parallel at the contact point becomes 4Z0 when only a switch element (M4/M7) is turned on, 1.9Z0 when only a switch element (M4, M5)/(M7, M8) is turned on, and 0.85Z0 when all switching elements (M4, M5, M6)/(M7, M8, M9) are turned on.

Each switch element (transistor) may be turned on and off by adjusting voltages Vc1 to Vc12 applied to the gate through a 20 kOhm resistor to 1 V or 0 V. FIG. 10 illustrates an example in which attenuation states of 0 to 14 dB are implemented as each switch element is turned on and off. In order to implement each attenuation state, there may be various combinations of turning on and off the switch element, but an example was implemented as illustrated in FIG. 10 in consideration of low insertion loss.

By disposing a transmission line having an electrical length of 51° instead of a transmission line having an electrical length of 90° between the attenuation cells, a chip area was reduced and low insertion loss was ensured.

A signal flow of the attenuator illustrated in FIG. 8 will be described.

Among total 15 attenuation states 0 to 14 dB, attenuation states 0 dB, 1 dB, 3 dB, 7 dB, 12 dB and 14 dB will be described, respectively.

The 0 dB attenuation state is a state in which all switch elements in the attenuation cell are turned off. Therefore, since the signal flows along the transmission line and all the switch elements in the attenuation cell are turned off, no attenuation occurs at all. Thus, the input signal may reach the output end without attenuation.

In the 1 dB attenuation state, only a switch element M4 of a second attenuation cell is turned on. When the signal flows along the transmission line and passes through a contact point P2, 1 dB attenuation occurs according to the on state of the switch element M4. Since the signal passing through P2 is no longer attenuated in the attenuation cell, the input signal attenuated by 1 dB reaches the output end.

In the 3 dB attenuation state, the switch elements M4 and M5 of the second attenuation cell and a switch element M7 of a third attenuation cell are turned on. Accordingly, when the signal flows along the transmission line and passes through the contact point P2, 2 dB attenuation occurs and 1 dB attenuation additionally occurs when passing through the contact point P3. The signal passing through P3 is no longer attenuated, and a total of 3 dB attenuated input signal reaches the output end.

In the 7 dB attenuation state, the switch element M1 of the first attenuation cell, the switch elements M4, M5, and M6 of the second attenuation cell, and the switch elements M7 and M8 of the third attenuation cell are turned on. Therefore, the signal flows along the transmission line, the 1 dB attenuation occurs at the contact point P1, 4 dB attenuation additionally occurs when passing through the contact point P2, and 2 dB attenuation additionally occurs when passing through the contact point P3. The signal passing through P3 is no longer attenuated, and a total of 7 dB attenuated input signal reaches the output end.

A 12 dB attenuation state will be described. In the case of the 12 dB attenuation state, all the switch elements M1 to M10 of the first to third attenuation cells except for switch elements M11 and M12 of a fourth attenuation cell are turned on. Accordingly, the signal flows along the transmission line, 3 dB attenuation occurs at the contact point P1, 4 dB attenuation occurs at the contact point P2, 4 dB attenuation occurs at the contact point P3, and 1 dB attenuation occurs at the contact point P4. Therefore, the total 12 dB attenuated input signal reaches the output end.

In a 14 dB attenuation state, all the switch elements in the first to fourth attenuation cells are turned on. Accordingly, the signal flows along the transmission line, 3 dB attenuation occurs at the contact point P1, 4 dB attenuation additionally occurs at the contact point P2, 4 dB attenuation additionally occurs at the contact point P3, and finally, 3 dB attenuation occurs at the contact point P4. Therefore, the total 14 dB attenuated input signal reaches the output end.

FIG. 11 is a diagram showing a photograph of a chip of the attenuator. The area of the attenuator core is 980×210 µm$^2$.

FIG. 12 shows the performance of an attenuator according to an embodiment of the present invention, and shows $S_{21}$ and a maximum attenuation range of all attenuation states of the attenuator.

FIG. 13 shows P1 dB measured at 35 GHz, and P1 dB may be defined as a point at which the maximum attenuation range decreases by 1 dB based on when the intensity of the input signal is −10 dBm. As shown in FIG. 13, it can be seen that P1 dB is 14 dBm.

FIG. 14 is a graph showing input/output matching characteristics of an attenuator according to an embodiment of the present invention. As shown in FIG. 14, it can be seen that excellent matching performance is shown within a bandwidth.

The hardware device described above may be configured to be operated with one or more software modules in order to perform the operation of the present invention and vice versa.

Hereinabove, the present invention has been described with reference to the embodiments thereof. It is understood to those skilled in the art that the present invention may be implemented as a modified form without departing from an essential characteristic of the present invention. Therefore, the disclosed embodiments should be considered in an illustrative viewpoint rather than a restrictive viewpoint. The scope of the present invention is defined by the appended claims rather than by the foregoing description, and all differences within the scope of equivalents thereof should be construed as being included in the present invention.

What is claimed is:

1. A compact digital attenuator comprising:
a first attenuation cell to an nth attenuation cell connected in parallel to each other through a transmission line,
wherein each of the first to nth attenuation cells includes a plurality of switch elements connected in parallel to each other,
wherein the plurality of switch elements are connected to the transmission line through one contact point,
wherein each of the plurality of switch elements is an N-type transistor that is any one of an N-type FET and an N-type BJT,
wherein each drain of the plurality of switch elements included in each of the first to nth attenuation cells is connected to the transmission line through one contact point, and each source of the plurality of switch elements included in each of the first to nth attenuation cells is connected to a ground,
wherein each of the first to nth attenuation cells has a multi-attenuation state, and
wherein the plurality of switch elements included in each of the first to nth attenuation cells are selectively turned on according to an attenuation state.

2. The compact digital attenuator of claim 1,
wherein the plurality of switch elements included in each of the first to nth attenuation cells are turned off as a default,
wherein any one of the plurality of switch elements is selectively turned on according to the attenuation state to attenuate a signal, and
wherein sizes of the plurality of switch elements are different from each other.

3. The compact digital attenuator of claim 1,
wherein the plurality of switch elements included in each of the first to nth attenuation cells are turned off as a default, and
wherein a number of switch elements to be turned on according to the attenuation state varies, and a signal input through the transmission line is attenuated in response to a value obtained by calculating resistors of the turned-on switch elements in parallel.

* * * * *